United States Patent
Lin et al.

(10) Patent No.: US 9,058,974 B2
(45) Date of Patent: Jun. 16, 2015

(54) DISTORTING DONOR WAFER TO CORRESPONDING DISTORTION OF HOST WAFER

(71) Applicant: INTERNATIONAL BUSINESS MACHINES CORPORATION, Armonk, NY (US)

(72) Inventors: Wei Lin, Albany, NY (US); Spyridon Skordas, Wappingers Falls, NY (US); Tuan A. Vo, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 79 days.

(21) Appl. No.: 13/908,510

(22) Filed: Jun. 3, 2013

(65) Prior Publication Data

US 2014/0356983 A1    Dec. 4, 2014

(51) Int. Cl.
| | |
|---|---|
| *H01L 21/00* | (2006.01) |
| *H01L 21/02* | (2006.01) |
| *B32B 38/18* | (2006.01) |
| *B32B 38/00* | (2006.01) |

(52) U.S. Cl.
CPC ...... *H01L 21/02035* (2013.01); *B32B 38/1825* (2013.01); *Y10T 156/17* (2015.01); *B32B 38/0012* (2013.01); *B32B 2457/14* (2013.01)

(58) Field of Classification Search
CPC .. B23B 31/12; B23B 38/1825; H01L 21/762; H01L 21/02035; Y10T 156/17
USPC .................................................. 156/308.2, 64
See application file for complete search history.

(56) References Cited

U.S. PATENT DOCUMENTS

| | | | | |
|---|---|---|---|---|
| 4,506,184 | A * | 3/1985 | Siddall | 310/328 |
| 5,094,536 | A * | 3/1992 | MacDonald et al. | 356/514 |
| 5,236,118 | A * | 8/1993 | Bower et al. | 228/193 |
| RE36,890 | E | 10/2000 | Wells et al. | |
| 6,382,609 | B1 | 5/2002 | Namioka et al. | |
| 6,446,948 | B1 * | 9/2002 | Allen | 269/21 |
| 6,833,312 | B2 | 12/2004 | Yanagita et al. | |
| 7,378,332 | B2 | 5/2008 | Tomita et al. | |
| 7,425,465 | B2 | 9/2008 | Birkmeyer | |

(Continued)

FOREIGN PATENT DOCUMENTS

| | | | |
|---|---|---|---|
| JP | 2012175041 A * | 9/2012 | |
| JP | 2013120901 A * | 6/2013 | |

OTHER PUBLICATIONS

Berthold, A., et al. "Wafer-to-wafer fusion bonding of oxidized silicon to silicon at low temperatures". Sensors and Actuators A 68 (1998) pp. 410-413. Copyright 1998 Elsevier Science S.A.

(Continued)

*Primary Examiner* — Brett Feeney
*Assistant Examiner* — Sophia Nguyen
(74) *Attorney, Agent, or Firm* — David Zwick; Catherine Ivers

(57) ABSTRACT

Improving wafer-to-wafer bonding alignment. Determining planar distortions of the bonding surface of a host wafer. Mounting a donor wafer on a bonding chuck by a plurality of fixation points, the bonding chuck including multiple zones capable of movement relative to each other. Distorting the bonding surface of the donor wafer by moving the zones of the bonding chuck relative to each other to cause distortions of the bonding surface of the donor wafer such that the distortions of the donor wafer bonding surface correspond to the determined planar distortions of the host wafer bonding surface.

6 Claims, 9 Drawing Sheets

(56) References Cited

U.S. PATENT DOCUMENTS

| | | | |
|---|---|---|---|
| 7,713,369 B2 | 5/2010 | Aspar et al. | |
| 7,936,062 B2 | 5/2011 | Humpston et al. | |
| 8,119,500 B2 | 2/2012 | Yang et al. | |
| 8,133,799 B2 | 3/2012 | Osenbach et al. | |
| 2004/0036850 A1* | 2/2004 | Tsukamoto et al. | 355/72 |
| 2004/0196444 A1* | 10/2004 | Chiba et al. | 355/52 |
| 2004/0224480 A1* | 11/2004 | Forbes | 438/455 |
| 2006/0023394 A1* | 2/2006 | Bain et al. | 361/234 |
| 2008/0224364 A1* | 9/2008 | Funk | 264/571 |
| 2009/0130821 A1* | 5/2009 | Cox et al. | 438/455 |
| 2009/0171495 A1* | 7/2009 | Shih et al. | 700/121 |
| 2010/0122762 A1 | 5/2010 | George | |
| 2011/0069467 A1 | 3/2011 | Flaim et al. | |
| 2011/0150347 A1* | 6/2011 | Wang et al. | 382/218 |
| 2011/0207291 A1 | 8/2011 | Tsuno et al. | |
| 2012/0026478 A1* | 2/2012 | Chen et al. | 355/53 |
| 2012/0077329 A1* | 3/2012 | Broekaart et al. | 438/455 |
| 2012/0251789 A1* | 10/2012 | Tanaka et al. | 428/170 |
| 2012/0255365 A1* | 10/2012 | Wimplinger | 73/760 |
| 2012/0288643 A1 | 11/2012 | Donis | |
| 2012/0318432 A1* | 12/2012 | Nishibayashi et al. | 156/64 |
| 2012/0329241 A1* | 12/2012 | Yamaguchi et al. | 438/455 |
| 2013/0330165 A1* | 12/2013 | Wimplinger et al. | 414/800 |
| 2014/0261960 A1* | 9/2014 | Lin et al. | 156/64 |
| 2014/0265165 A1* | 9/2014 | Lin et al. | 279/142 |
| 2014/0278213 A1* | 9/2014 | Hsieh et al. | 702/150 |

OTHER PUBLICATIONS

Cassidy, C. et al., Wafer-Bond Micro-Void Physical Analysis. Challenges for Three-Dimensional (3D) ICS and Systems. Workshop Program Monday, Nov. 28, 2011. <http://philippe.perdu.free.fr/workshops/workshop2011/3D/program.htm>.

Eichler, M., et al. "Effects on Silanol Condensation during Low Temperature Silicon Fusion Bonding". Journal of The Electrochemical Society. 156 (10) pp. H786-H793 (2009).

Heyvaert, I., et al. "Effect of oxide and W-CMP on the material properties and electromigration behaviour of layered aluminum metallisations". Microelectronic Engineering 50 (2000) pp. 291-299. Copyright 2000 Elsevier Science B.V.

Lin, W., et al. U.S. Appl. No. 13/826,229, filed Mar. 14, 2013.

Lin, W., et al. U.S. Appl. No. 13/828,340, filed Mar. 14, 2013.

"Van der Waals force-Wikipedia, the free encyclopedia". [online] [retrieved on Dec. 13, 2012]. <http://en.wikipedia.org/wiki/Van_der_Waals_force>.

\* cited by examiner

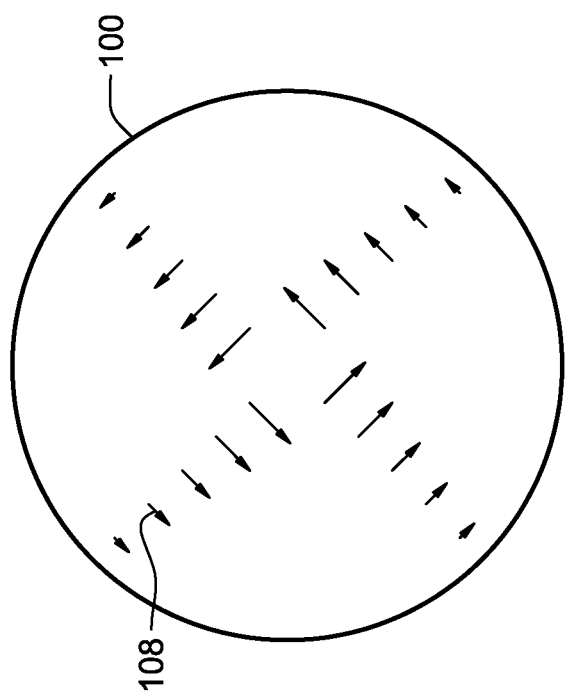

DISTORTING DONOR WAFER TO CORRESPONDING DISTORTION OF HOST WAFER

FIELD OF THE INVENTION

The present invention relates generally to the field of bonding semiconductor substrates as part of a semiconductor device manufacturing process, and more particularly to distorting a donor wafer to introduce corresponding planar bonding surface distortion to that of the bonding surface of a host wafer.

BACKGROUND OF THE INVENTION

Semiconductor devices are typically produced in arrays on wafer substrates ranging from 1 to 18 inches in diameter. The substrates are then separated into individual devices or dies that are packaged to allow practical macro-level connection of the devices in the context of a larger circuit. As the requirements for chip density and smaller packaging form factors increase, advances have been made in three-dimensional integration of circuits. In this technology, devices are stacked and bonded in the vertical or z-direction. Typically, the stacked devices are electrically coupled by electrical contact pads on the devices or by through-silicon vias (TSVs).

A typical process for vertically integrating devices on silicon wafers is a wafer-to-wafer integration scheme in which the host wafer and donor wafer are aligned with one another, and the wafers are bonded together using oxide-oxide fusion bonding. The donor wafer is then thinned to expose through silicon vias that connect to the host wafer, or is thinned followed by fabrication of through silicon vias that connect to the host wafer.

A long-recognized challenge in producing vertically integrated devices is reducing distortion of the wafers and wafer stack introduced during the manufacturing process. A common mechanism that introduces distortion is the disparate degrees of thermal expansion on the various components of a wafer or wafer stack. For example, the components and materials present on a wafer will typically have different coefficients of thermal expansion. At different steps of the integrated device manufacturing process, the wafers and wafer stacks will be exposed to different process temperatures, which may include thermal gradients in the wafer or wafer stack during production. Because of the different coefficients of thermal expansion, each process step taking place at a different temperature will result in differential dimensional changes between wafer components and materials, which can manifest as fixed distortion from the undistorted ideal dimensions and positions. Stresses and strains to the wafer surface may also be caused by various mechanical and chemical processes, thinning, and differences in pattern densities. Planar surface distortions between wafers may be made permanent by the bonding of the wafer surfaces.

It would be desirable to have a bonding process that reduces, eliminates, or reverses the incoming relative planar distortion between the host and donor wafer surfaces, thus improving wafer-to-wafer bonding alignment.

SUMMARY

Embodiments of the present disclosure describe a method generally for improving wafer-to-wafer bonding alignment. Planar distortions of the bonding surface of a host wafer are determined. The bonding surface of a donor wafer is distorted such that the distortions of the donor wafer bonding surface correspond to the determined planar distortions of the host wafer bonding surface.

Other embodiments describe a method to separate bonded wafers. A bonded wafer pair is mounted between first and second bonding chucks having flat chuck faces, the first bonding chuck face including adjustable zones capable of movement relative to each other, at least a component of the relative movement is along an axis that is perpendicular to the flat first bonding chuck face. The adjustable zones of the first face are moved relative to each other in a coordinated manner such that a widening gap is formed between the bonding faces of the wafer pair.

BRIEF DESCRIPTION OF THE SEVERAL VIEWS OF THE DRAWINGS

FIGS. 1A, 1B, and 1C illustrate barrel, pincushion, and rotational distortions on a wafer bonding surface, in accordance with an embodiment of the present invention.

DETAILED DESCRIPTION

Embodiments of the invention described herein are directed to a process that improves alignment during wafer to wafer bonding. In the disclosed embodiments, planar distortions on the bonding surface of the host wafer are detected, and corresponding distortions are introduced on the bonding surface of the donor wafer through the use of an adjustable multi-zone bonding chuck in which the zones can move relative to each other. As used herein, planar distortions generally refer to distortions along the bonding surface, and may be approximated, for example, by projecting distortions onto the general plane of the bonding surface. Except where specifically referenced, distortion perpendicular to the plane of the bonding surface is generally ignored. In exemplary embodiments of the invention described in the present disclosure, an adjustable multi-zone bonding chuck, as disclosed in U.S. patent application Ser. No. 13/828,340 to Lin, et al. ("Lin1"), titled "Wafer-to-Wafer Fusion Bonding Chuck," may be used, as well as a bonding process that may use the adjustable multi-zone bonding chuck, as disclosed in U.S. patent application Ser. No. 13/826,229 to Lin, et al. ("Lin2"), titled "Wafer-to-Wafer Oxide Fusion Bonding."

Planar distortions on a wafer surface can generally be characterized into three types: expansion distortions, such as barrel distortions and pincushion distortions; rotational distortions, such as twist and spiral distortions; and translational distortions, such as an overall movement of an area in the X-Y plane while maintaining an orientation with respect to the X-Y axes. These distortions may occur at the micro level, for example, a small area of a wafer surface, and at the macro level, for example, over the entire bonding surface of a wafer. In exemplary embodiments, at the macro level, expansion distortions and rotational distortions are generally with respect to the wafer center, with expansion distortion referring to the component of distortion from ideal generally along radii of the wafer, and rotational distortion referring to the component of distortion generally perpendicular to radii of the wafer. In general, planar distortion of a wafer surface can include components of all three types of distortion, at both a macro level and a micro level. The magnitude of these distortions is typically in the parts-per-million range, and may result in macro level distortions from the ideal in the several micron range.

A typical method to mitigate the effects of planar distortion on a wafer bonding surface is to oversize the contact and TSV landing pads. This may be in addition to over-designing the landing pad size to overcome translational and rotational alignment limitations in the wafer bonding alignment process. Such over-designing may present an obstacle to reducing component and die density on semiconductor wafers.

Figure 1B:
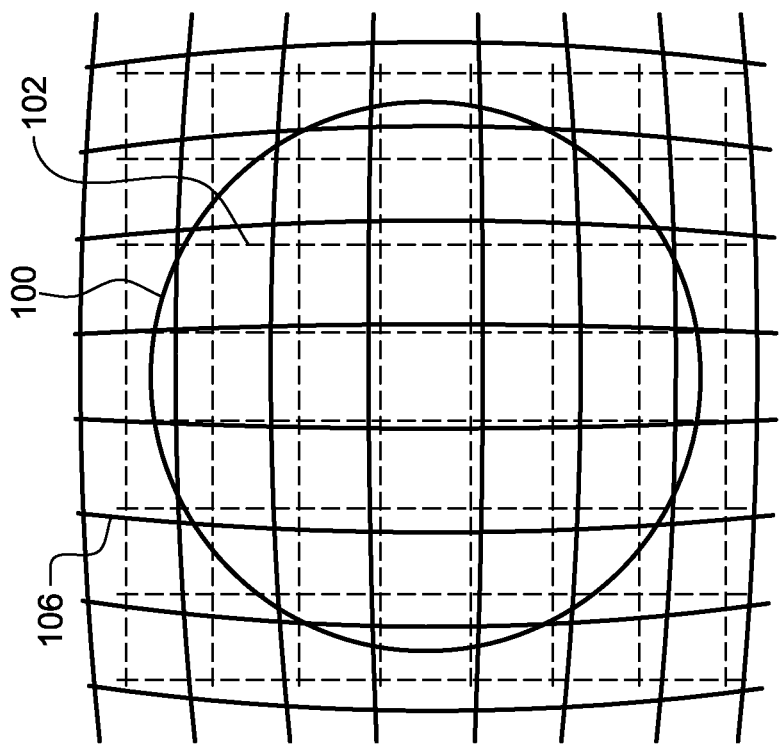
Figure 1A:
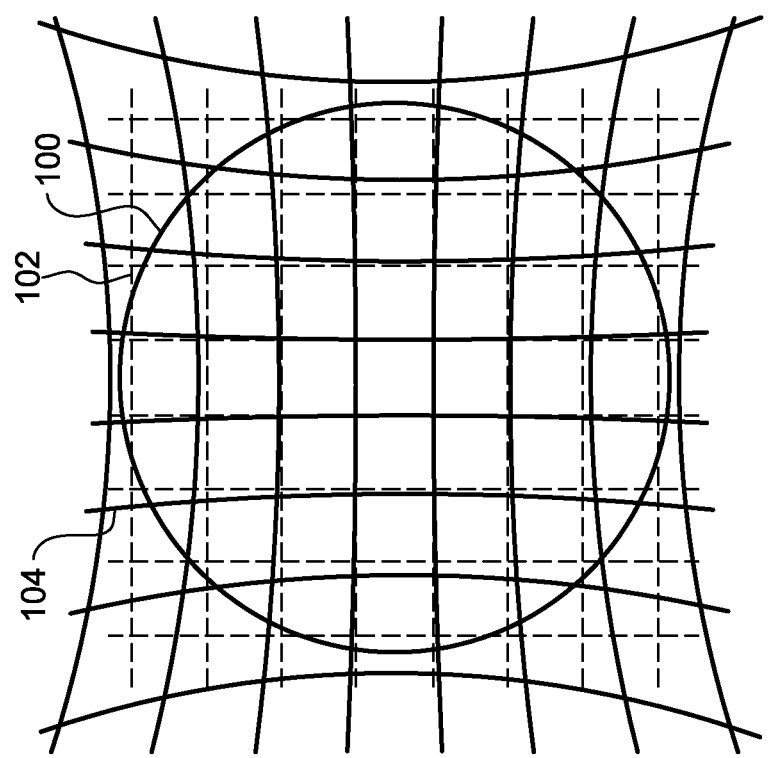

FIGS. 1A-1C illustrate the first two aforementioned types of planar distortion—expansion and rotational—that may be present on the surface of a wafer 100. FIG. 1A shows a pincushion distortion, as illustrated by a distorted grid 104 with relation to an ideal grid 102. Similarly, FIG. 1B shows a barrel distortion, as illustrated by a distorted grid 106 with relation to ideal grid 102. FIG. 1C shows a rotational distortion, as illustrated by a vector field 108. Each vector of the vector field represents a direction and magnitude of the distortion from ideal of a particle on the undistorted surface of wafer 100 to which the origin of the vector is connected. As shown in this illustration of a pure rotational distortion, all distortions are perpendicular to radii of wafer 100, with the vector magnitude largest near the center of the wafer, decreasing to zero at the edge. This exemplary distortion is typically called a "twist" distortion. With regard to translational distortion, the third type of distortion mentioned above, at a macro level, this may often be counteracted through alignment of the wafers prior to bonding.

Figure 2:
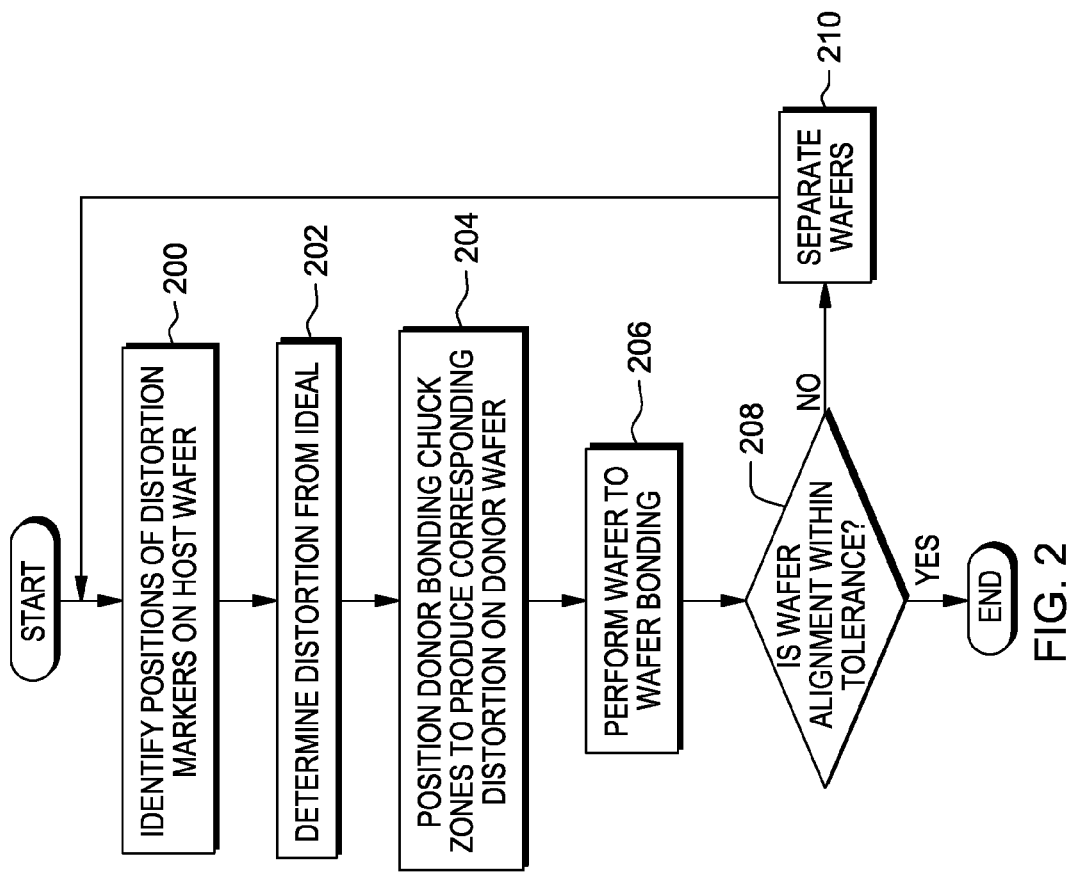
FIG. 2 is a flowchart showing operational steps of a process for bonding a donor wafer to a host wafer having planar distortion on its bonding face, in accordance with embodiments of the invention.

FIG. 2 is a flowchart showing operational steps of a process for bonding a donor wafer to a host wafer having planar distortion on its bonding face, in accordance with embodiments of the invention.

The process begins by identifying the planar positions of distortion markers of a host wafer (step 200). As used in this disclosure, with respect to exemplary embodiments, a host wafer is the wafer to which additional wafers are bonded to form a wafer stack. The donor wafer is typically a single wafer that is bonded to the host wafer. In this embodiment, distortion is determined for the bonding surface of the host wafer because it will typically be the wafer that may have experienced multiple thermal cycles and wafer thinning operations, etc., during stack creation. The donor wafer typically will not have experienced the thermal cycles associated with wafer bonding. As mentioned above, a major contributor to wafer surface distortions are the disparate degrees of thermal expansion of the various components of a wafer stack during stack production.

In preferred embodiments, distortion markers may be alignment or reference structures used for alignment during the photolithography or the bonding process steps. A distortion marker may also be any surface or near-surface structure visible from the bonding surface side that a lithographic alignment tool or an automated microscope can be trained to detect. In preferred embodiments, the distortion marker structure has a defined point or very small region that the alignment tool or the automated microscope can be trained to detect. For example, the distortion marker structure may have a corner or chevron point or a cross center that may be used for training. While a suitable number of distortion markers may depend on the diameter of the wafer and the geometry and number of adjustable zones of the donor bonding chuck, exemplary embodiments may have on the order of a hundred or more distortion markers, preferably at least one such marker per chip. In exemplary embodiments, the planar positions of distortion markers may be identified while the wafer is secured in the host wafer bonding chuck, and the chuck is mounted in an automated microscope or photolithography tool.

Figure 3:
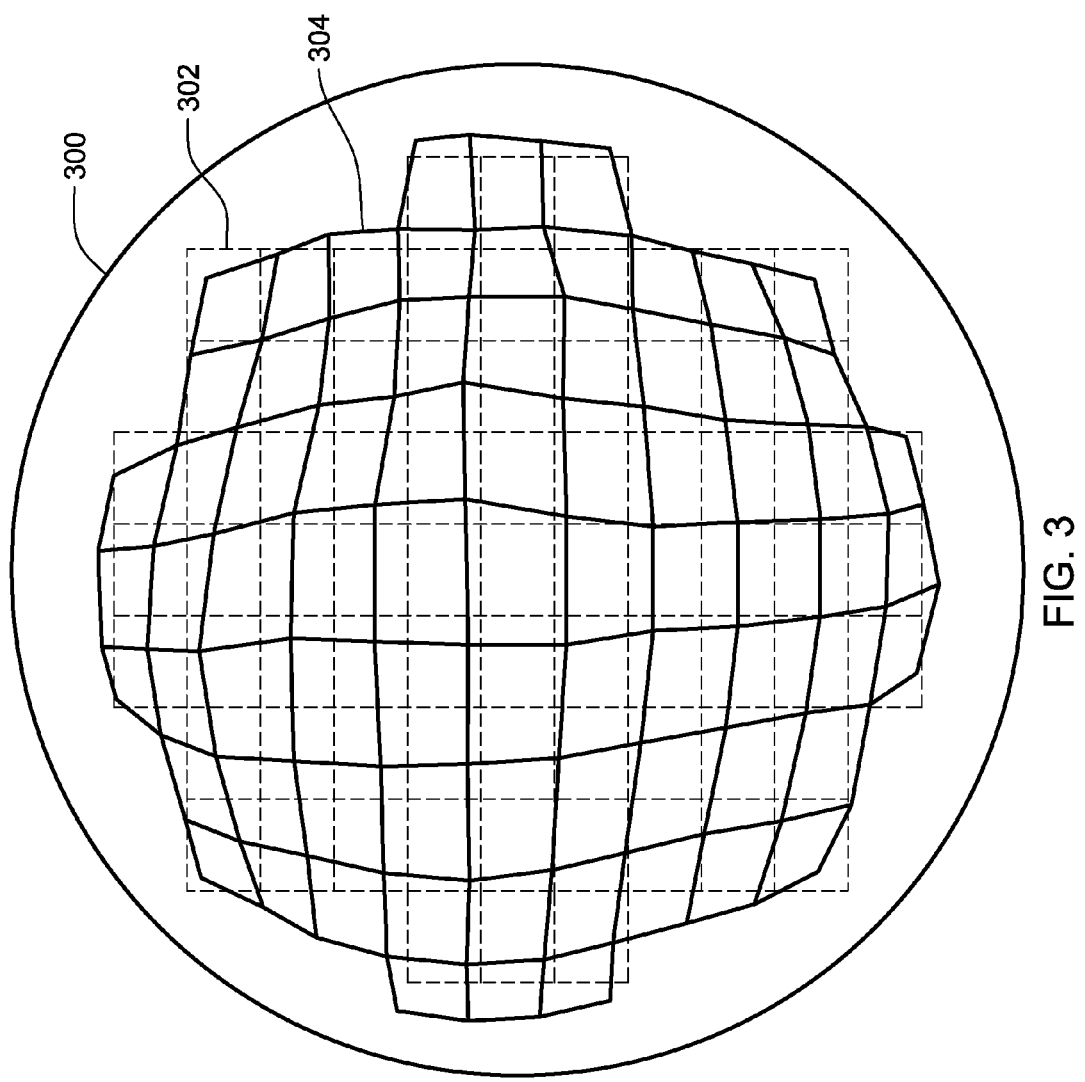
FIG. 3 illustrates an exemplary distortion pattern on the surface of a host wafer with relation to an ideal grid, in accordance with an embodiment of the present invention.

After the positions of the distortion markers are identified, the planar surface distortions from ideal are determined (step 202). FIG. 3 illustrates an exemplary distortion pattern 304 on the surface of a wafer 300 with relation to an ideal grid 302. Each intersection of a vertical and horizontal line of ideal grid 302 represents the ideal undistorted position of a distortion marker. Similarly, each intersection of a longitude line (predominantly vertical) and latitude line (predominantly horizontal) of distortion pattern 304 represents the distorted position of a distortion marker. As shown, the distortion pattern indicates that the distortion is primarily a barrel distortion. For illustrative purposes, distortion pattern 304 has been greatly exaggerated.

In an exemplary embodiment, distortion from ideal is determined by comparing the distorted position of a distortion marker to the ideal position of the marker. Because actual distortion is in the parts-per-million range, and the number of distortion markers is in the hundred or more range per wafer bonding surface, as mentioned above, identifying the ideal undistorted position associated with a distortion marker should not be difficult. The distortion from ideal for each distortion marker may be stored in a data structure, such as an array, table, or list.

Figure 4:
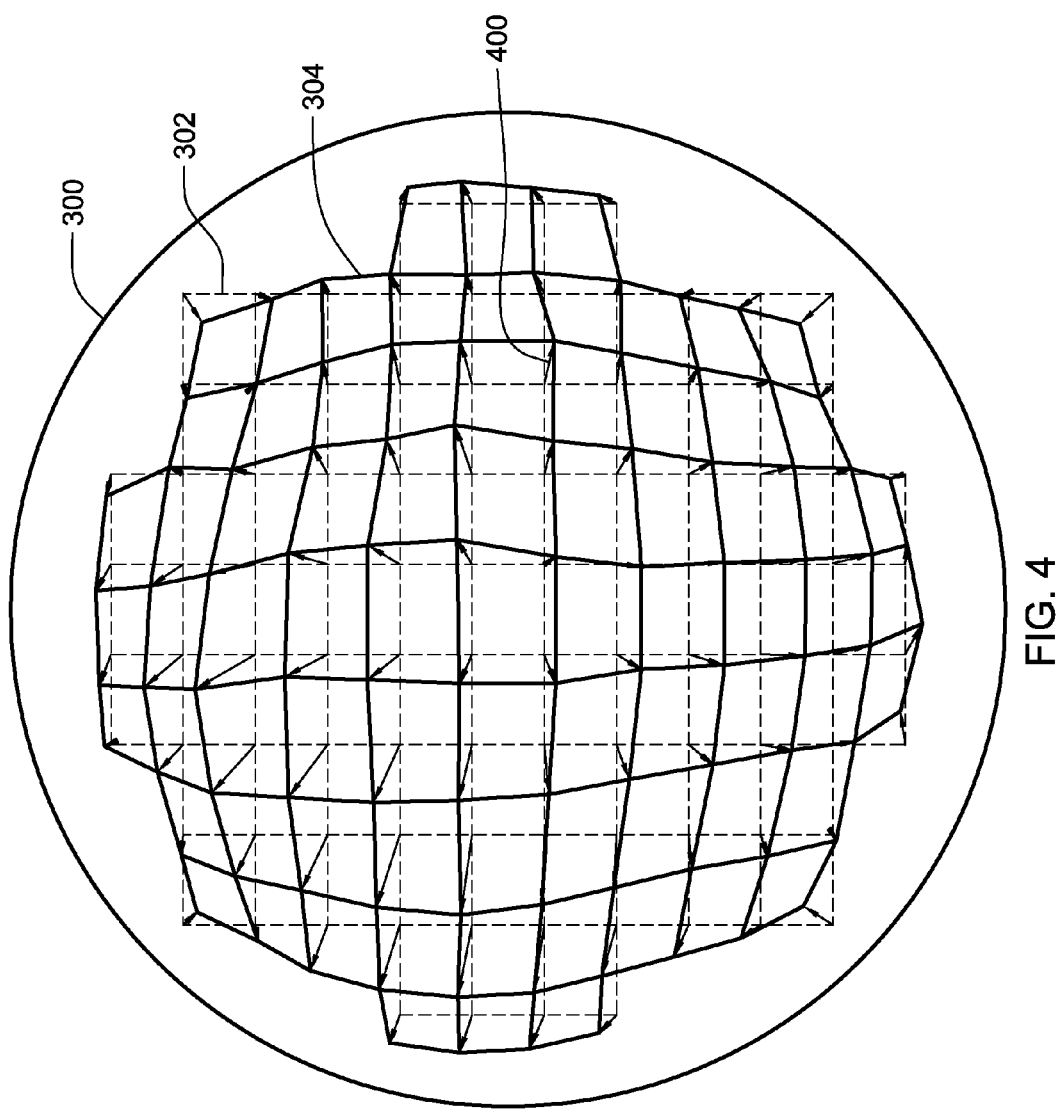
FIG. 4 shows a distortion vector field representing the distortion from ideal of each distortion marker for the host wafer of FIG. 3, in accordance with an embodiment of the present invention.
Figure 5:
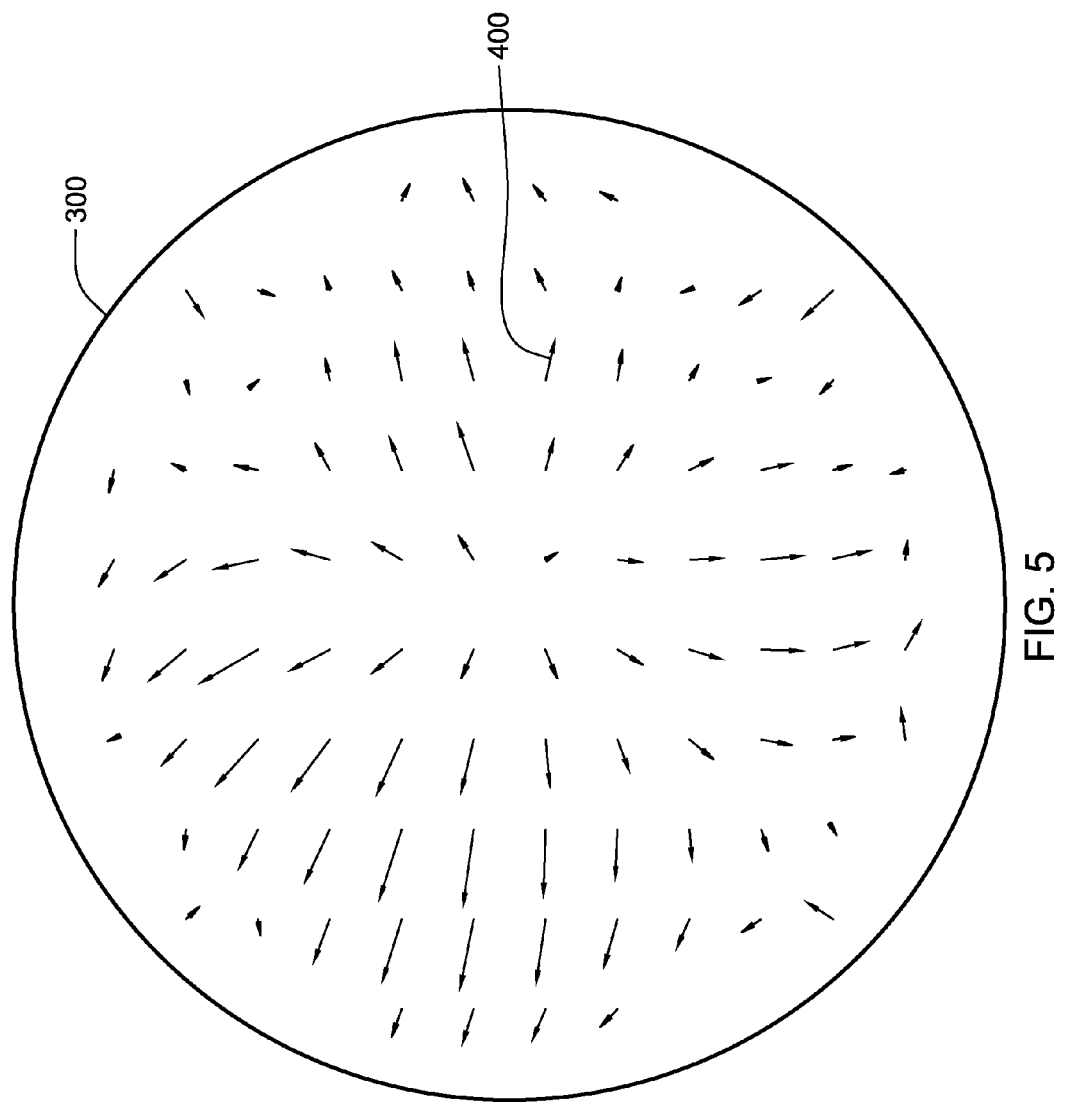
FIG. 5 more clearly shows an isolation of the distortion vector field of the host wafer of FIG. 4, in accordance with an embodiment of the present invention.

In an exemplary embodiment, the distortion data structure includes a distortion vector associated with each distortion marker representing the direction and magnitude of the movement of a reference point of the distortion marker at the ideal position to the distorted position of the associated distortion marker. All distortion vectors taken together form a distortion vector field. An analysis of the distortion vector field can determine expansion, rotation, and translation components of the surface distortion of a wafer. FIG. 4 shows a distortion vector field 400 representing the distortion from ideal of each distortion marker for wafer 300. FIG. 5 shows the distortion vector field 400 of wafer 300 in isolation.

After the planar surface distortion from ideal for each distortion marker has been determined, the position for each zone of the adjustable zone bonding chuck to which a donor wafer is attached is determined (step 204). In exemplary embodiments, the relative positioning of the adjustable zones will produce an expansion distortion on the surface of the donor wafer that corresponds to the planar distortion on the surface of the host wafer so as to result in improved alignment of the wafers after bonding.

Figure 6:
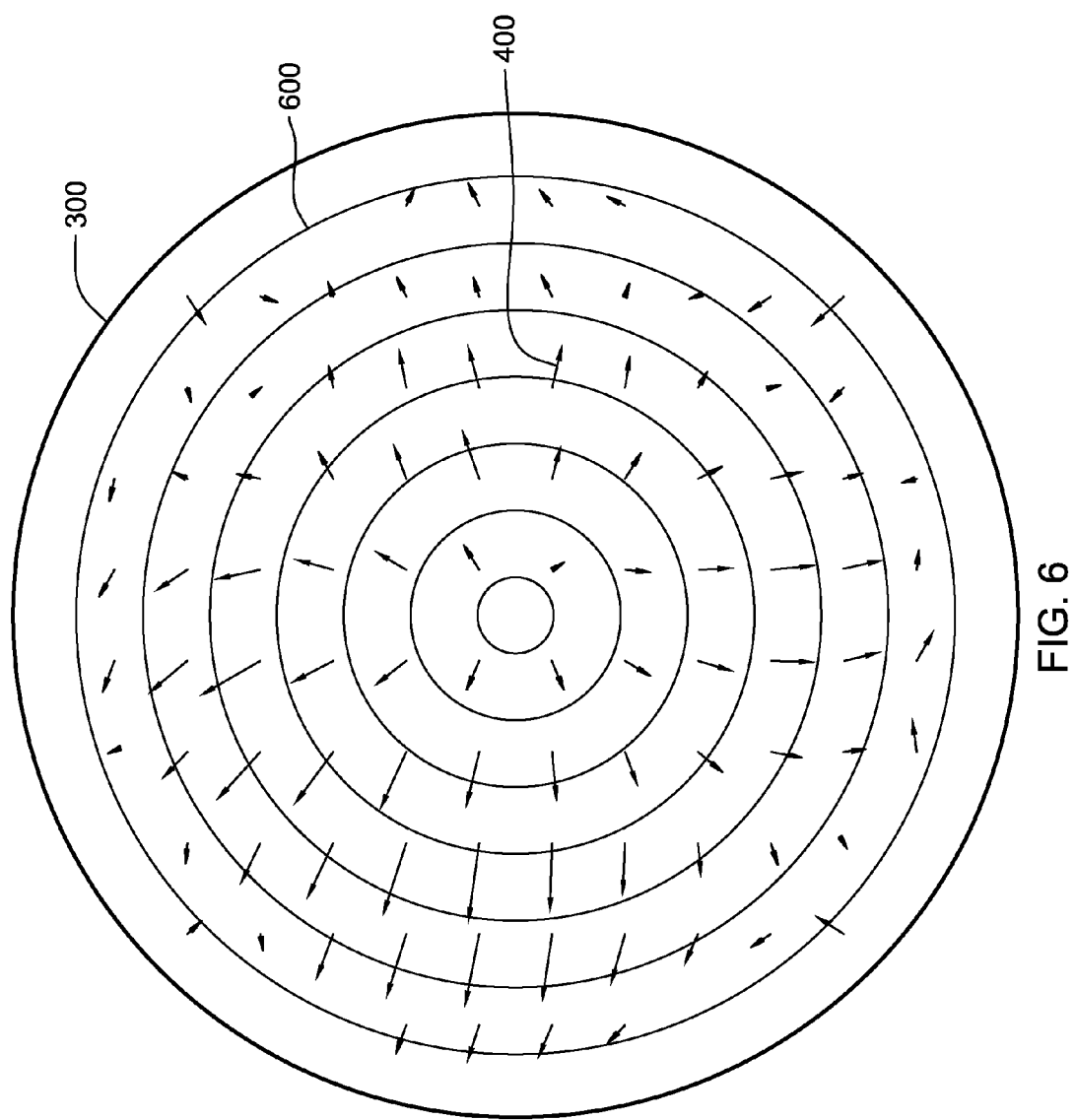
FIG. 6 shows the distortion vector field of the host wafer of FIG. 5, with the zone boundaries of an exemplary embodiment of an adjustable zone donor bonding chuck superimposed on the bonding face of host wafer, in accordance with an embodiment of the present invention.

FIG. 6 shows distortion vector field 400 on the bonding face of host wafer 300, with the zone boundaries of an exemplary embodiment of an adjustable zone bonding chuck, as disclosed in Lin1, superimposed on the bonding face of host wafer 300. As shown, the embodiment of the adjustable zone bonding chuck has zones having the geometry of symmetrical circular concentric annular rings about the center of the donor wafer. For example, the boundary between the outermost annular zone and the adjacent inner annular zone is indicated by circle 600.

Figure 7:
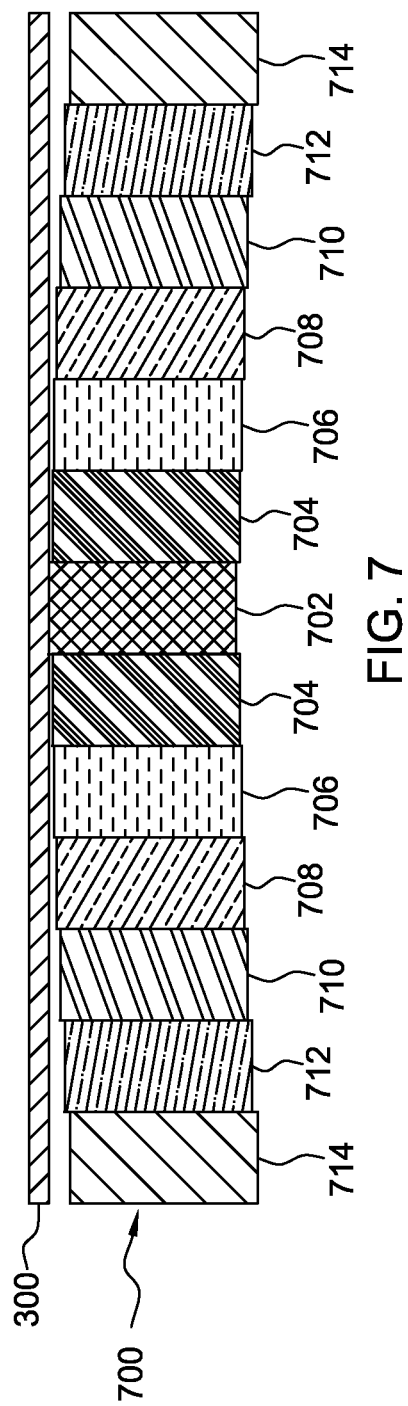
FIG. 7 is a cross-sectional view of an adjustable zone bonding chuck, in accordance with an embodiment of the present invention.

FIG. 7 is a cross-sectional view of an example of an adjustable zone bonding chuck, as discussed with respect to FIG. 6 and disclosed in Lin1. Adjustable zone bonding chuck 700 has a central zone 702 surrounded by multiple annular outer zones 704 to 714. Bonding chuck zones 702 to 714 may move relative to each other in a shear direction along an axis that may be perpendicular to the planar surfaces of the chuck faces of the chuck zones. In various embodiments of the invention, each chuck zone can be raised or lowered relative to the other chuck zones. In certain embodiments, the chuck face edges of chuck zones 702 to 714 may be chamfered or radiused so as to reduce stress in wafer 300 across the boundary between chuck zones. In preferred embodiments, the movement of chuck zones 702 to 714 may be controlled, for example, by a precision hydraulic piston arrangements, so as to allow for movements in the approximately 0.1 micron to approximately 1 micron range with a movement of chuck zones 702 to 714 in the approximately 0.1 micron to approximately 100 micron range. In certain embodiments, one or more chuck zones 702 to 714 may have vacuum channels (not shown), electrostatic force, or other releasable means for holding a wafer in place against the chuck face of the chuck.

The component of distortion in a given direction on the surface of a wafer can be determined by comparing the magnitudes of the components of the distortion vectors along that direction. For example, in the exemplary embodiment, distortion pattern 304 of FIG. 3 shows that the surface distortion from ideal is predominantly a barrel distortion. Distortion vector field 400 illustrated on FIG. 6 confirms this, as the major component of most distortion vectors is outwardly radial from the center of wafer 300. To determine a distortion vector field in the radial direction, the dot product of each distortion vector and a radial unit vector having the same origin as the distortion vector can be calculated. Similarly, a distortion vector field can be calculated for determining the component of distortion in any direction by calculating the dot product of each distortion vector and a unit vector in the direction of interest having the same origin as the distortion vector. While these examples relate to macro level planar surface distortions, distortions can also be determined at a micro level by, for example, defining a distortion vector field that is centered about a point of interest, and limiting the number of distortion vectors to a defined surface area portion of the overall wafer surface. Those skilled in the art will recognize that suitable vector field interpolation techniques may be used to estimate distortion at points between distortion markers.

In an exemplary embodiment, the amount of distortion in a given direction between two points may be determined by the difference in magnitude of the components of the distortion vectors in the direction. For example, the radial distortion between two points along a given radius of a wafer may be determined by calculating the difference between the radial components of distortion for the distortion vectors with origins at the two points of interest. A non-zero difference in magnitude indicates that the two points have been distorted different radial amounts from the ideal, and, with respect to radial measurements from ideal, an expansion distortion has occurred. If the difference in magnitudes is zero, then the radial distance between the points is the same as between the ideal positions, although the points may have moved with respect to each other in another direction, for example, rotationally about the wafer center. Those skilled in the art will recognize that other methods, and combinations of methods, may be used to determine whether distortion has occurred between two points on the surface of a wafer.

Determining the relative positioning of adjacent donor bonding chuck zones may be based on the overall distortion amounts between adjacent zone position pairs where each position of the pair is a point on the surface of adjacent zones. For example, in an exemplary embodiment using adjustable zone bonding chuck 700 having concentric annular zones with vacuum fixation points around the radial center of each zone, the relative positioning can be determined based on the arithmetic average of the distortion amounts of radial position pairs, where the first position point of each pair is on the radial center of one annular chuck zone, the second position point of each pair is radially aligned with the first position point and is on the radial center of another annular chuck zone adjacent to the first zone, and the position pairs are evenly spaced around the annular chuck zones in terms of angle of arc. In another embodiment, the relative positioning between adjacent zones can be determined based on minimizing the sum of the squares of distortion for the position pairs.

Figure 8:
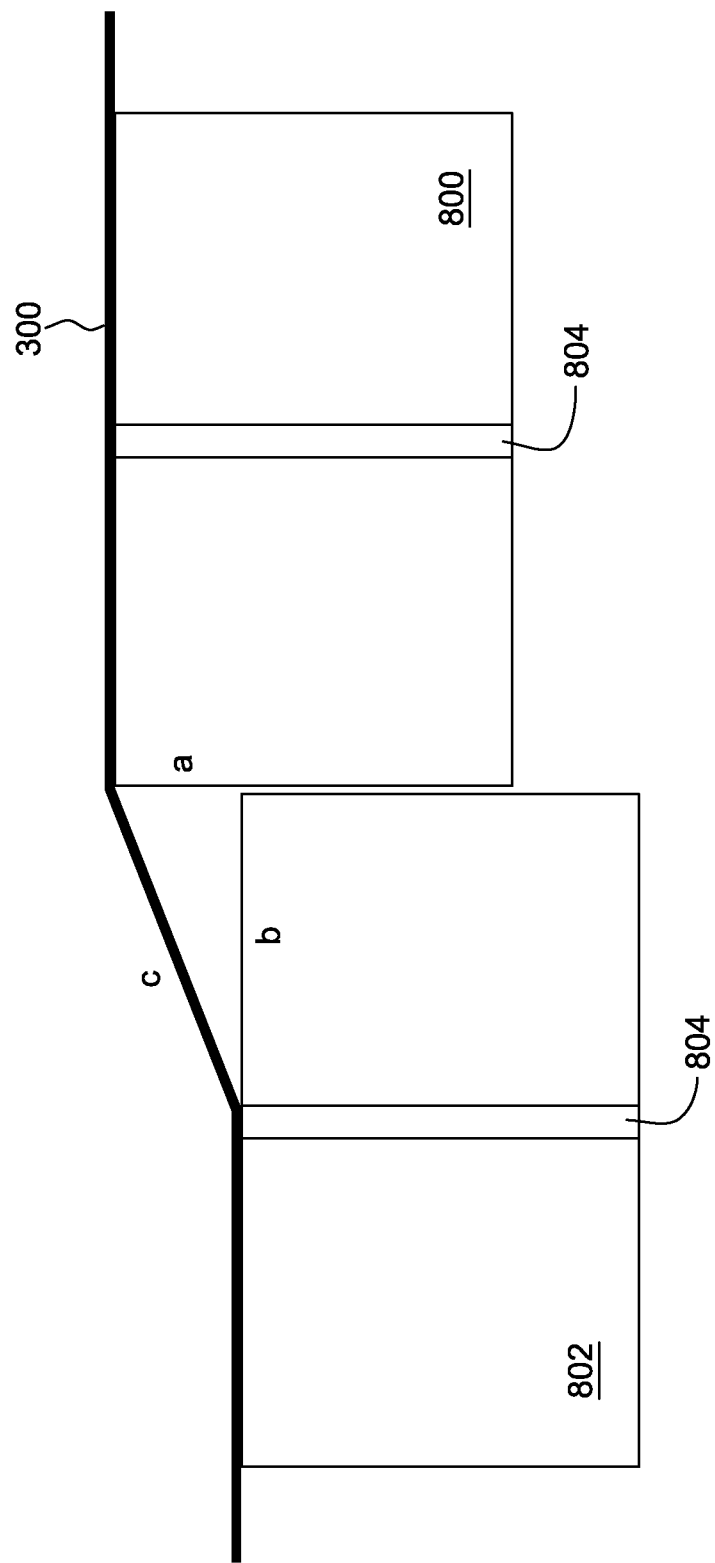
FIG. 8 shows a portion of a cross-section of the adjustable zone bonding chuck of FIG. 7 with a donor wafer mounted to the face of the bonding chuck, in accordance with an embodiment of the present invention.

After a desired expansion distortion amount between two vacuum channel fixation points on adjacent chuck zones is determined, distortion is introduced on the donor wafer surface by an expansion force caused by the relative positioning of adjacent zones. FIG. 8 shows a portion of a cross-section of an adjustable zone bonding chuck with wafer 300 fixed to the face of the bonding chuck. Wafer 300 is releasably fixed to the surface of adjacent adjustable zones 800 and 802, which may be, for example, any adjacent of zones 702 to 714, by vacuum channels 804. As illustrated, zones 800 and 802 have a relative vertical position distance of "a." Because wafer 300 is fixed to the chuck faces of zones 800 and 802 at vacuum channels 804 when the chuck faces of zones 800 and 802 are in planar alignment, the relative vertical positioning of zones 800 and 802 introduces an expansion distortion between the fixation points of the vacuum channels 804. Although the expansion distortion may span the distance between vacuum channels 804, the magnitude of the expansion distortion is determined by the difference in length between distance "b" and distance "c" caused by introducing the relative vertical position distance "a."

With regard to FIG. 8, the relation between the relative vertical positioning between adjacent adjustable zones 800 and 802, and the desired amount of expansion distortion $\Delta_e$ introduced between vacuum channel 804 wafer fixation points on the chuck faces of the zones is governed generally by a Pythagorean Theorem, as applied to the right triangle "abc", and may be expressed by the following equation:

$$a = \sqrt{(b+\Delta_e)^2 - b^2} \quad (1)$$

where "a" is the relative vertical positioning between adjacent adjustable chuck zones, "b" is the horizontal distance between the vacuum fixation point of adjustable zone 802 and the near edge of zone 800, and $\Delta_e$ is the desired amount of expansion distortion between vacuum channel 804 wafer fixation points. The desired expansion distortion is relative to an initial planar alignment positioning of adjustable zones 800 and 802. As can be seen from FIG. 8 and Equation (1), the traditional $c^2$ term maybe replaced by $(b+\Delta_e)^2$ because in the initial planar alignment positioning of adjustable zones 800 and 802, distance "a" is zero, and distance "c" equals distance "b".

In embodiments where the donor wafer chuck has adjustable annular zones, relative movement between two adjacent zones generally does not introduce distortion on the donor wafer except between the adjacent zones, because the two rings of vacuum fixation points around the two adjacent zones generally act to isolate the distortion between the two rings of vacuum fixation points. In other embodiments, for example, an adjustable zone chuck having a regular pattern of square or triangular zones that tile the plane of the bonding chuck face, relative movement between two chuck zones may introduce distortion between additional zones adjacent to the two chuck zones. Depending on the geometries of the donor chuck face zones, vector field and array operators, boundary value problem techniques, tensor analysis, and iterative processes may be used to arrive at chuck zone positions to introduce an optimum distortion on the donor wafer corresponding to a distortion on the bonding face of the host wafer. In certain embodiments, chuck zones may be capable of translational and rotational relative movements.

In certain embodiments, additional constraints may be imposed on the magnitude of the relative positioning between adjacent chuck zones. For example, if relative positioning will improve alignment in one area of the donor wafer but worsen alignment in another, relative positioning can be limited to a magnitude that will not cause an alignment error that is not within tolerance.

Because of the varying effects to the surface distortion of the donor wafer caused by, for example, the degree to which wafer deformations are elastic or plastic, and hysteresis effects, such as the time it takes for elastic deformations to recover, in certain embodiments, it may be desirable to introduce areas of more distortion onto the donor wafer than a distortion vector field analysis may indicate. Certain embodiments of the invention recognize that because an analytical determination of chuck zone positioning to produce a specific donor wafer distortion pattern may be difficult, based on such factors as the geometry of the chuck zones, the positioning of chuck zone vacuum channels, residual z-direction distortion caused by the relative positioning of adjacent zones, and the like, an empirical trial and error process, in addition to an analytical determination, may produce optimal results.

After distortion has been introduced on the donor wafer bonding surface through positioning of donor chuck adjustable zones, for example, adjustable zones 704 to 714 of bonding chuck 700, bonding of the donor wafer to the host wafer is performed (step 206). In an exemplary embodiment, the bonding may be an initial van der Waals force wafer-to-wafer fusion bonding process, such as disclosed in Lin2. For example, the adjustable donor wafer bonding chuck 700 is loaded into the bonding tool. Vacuum on the vacuum channels of the zones of adjustable zone bonding chuck 700 is at least partially released, except for the vacuum channel of central zone 702, so as to allow shear movement between the chuck faces of the adjustable zones and the back surface of donor wafer 300. Adjustable donor chuck zones 702 to 714 are then adjusted to a flat planar alignment. As mentioned above, the time it takes for elastic deformations to recover after wafer 300 is released from donor bonding chuck 700 may influence the magnitude of any over-distortion introduced onto donor wafer 300. In certain embodiments, a time interval between when the adjustable donor chuck zones 702 to 714 are adjusted to a flat planar alignment, thus releasing stress forces to the donor wafer, and when wafer-to-wafer bonding occurs may be adjusted to take advantage of differential elastic deformation recovery rates of different areas of the donor wafer bonding surface.

An initial room temperature bonding process may then be performed utilizing the combination of adjustable zone donor bonding chuck 700 holding donor wafer 300, and, for example, an edge-sloped host bonding chuck, as described in Lin2, holding a host wafer. In the initial room temperature bonding process, donor bonding chuck 700 and the host bonding chuck are brought within close proximity of each other. The center of wafer 300 on donor bonding chuck 700 may be biased downward, for example, by a center pin (not shown) that may be extended through donor bonding chuck 700, so that the bonding face of wafer 300 contacts the bonding face of the host wafer on the host bonding chuck. The vacuum on all vacuum channels in donor bonding chuck 700 may then be released, and donor wafer 300 snaps down onto the host wafer. A radial van der Waals force bonding wave propagates outward from the initial center contact point of the donor and host wafers, and an initial van der Waals force bond is formed between the wafer bonding faces. In an alternative embodiment, an initial bonding process may make use of coordinated movement of, for example, adjustable donor chuck zones 702 to 714. For example, adjustable donor chuck zones 702 to 714 may be arranged in an arched center-out profile with donor wafer 300 mounted to the face of adjustable zone donor bonding chuck 700 so as to allow shear movement between the chuck faces of the adjustable zones and the back surface of donor wafer 300. Contact between the wafers may be initiated at the wafer centers, and movement of adjustable donor chuck zones 702 to 714 can be coordinated to apply a wafer-wafer bonding force from the center zone of donor bonding chuck 700 progressively outward to the outermost annular zone.

In an exemplary embodiment, after the initial bonding process has completed, alignment between the host and donor wafer is tested to determine if the alignment is within tolerance (decision step 208). For example, wafer-wafer alignment can be tested at multiple locations using known methods, and if alignment is not within tolerance above a threshold number of locations (decision step 208, "N" branch), the host and donor wafers may be separated from each other (step 210), and the process can begin again (step 200). For example, with regard to adjustable zone donor chuck 700, a center-arched positional arrangement may be used to separate initially bonded wafers that were found not within alignment tolerance after the initial bonding process. In a center-arched arrangement, each annular chuck zone is in a lower position relative to the next chuck zone nearer central chuck zone 702, as illustrated in FIG. 7. An initially bonded host and donor wafer pair is held between a host chuck and adjustable zone bonding chuck 700 when the chuck zones of the adjustable chuck are in a coplanar positional arrangement. Vacuum is applied to all chuck vacuum channels of the host and donor chucks. Chuck zones 702 to 714 are then adjusted to a center-arched positional arrangement, thus allowing for separation of the wafer pair and allowing for realignment and initial bonding. In preferred embodiments, the movement of chuck zones 702 to 714 is coordinated so as to minimize the stress and strain in bottom wafer 302.

Based on the foregoing, a method has been disclosed for distorting a donor wafer to introduce corresponding planar distortion to that of the bonding surface of a host wafer. However, numerous modifications and substitutions can be made without deviating from the scope of the present invention. Therefore, the present invention has been disclosed by way of example and not limitation.

What is claimed is:

1. A method comprising:
   determining planar distortions of the bonding surface of a host wafer;
   mounting a donor wafer on a bonding chuck by a plurality of fixation points, the bonding chuck comprising multiple zones capable of movement relative to each other; and
   distorting the bonding surface of the donor wafer by moving the zones of the bonding chuck relative to each other to cause distortions of the bonding surface of the donor wafer such that the distortions of the donor wafer bonding surface correspond to the determined planar distortions of the host wafer bonding surface.

2. A method in accordance with claim 1, further comprising bonding the donor wafer and the host wafer after the step of distorting the donor wafer bonding surface.

3. A method in accordance with claim 1, wherein determining the planar distortions of the bonding surface of a host wafer comprises determining the positions of a plurality of distortion markers in the host wafer.

4. A method in accordance with claim 3, wherein each distortion marker is one of: a location on an alignment mark in the host wafer; and a location on a structure in the host wafer.

5. A method in accordance with claim 1, wherein:
   the planar distortions of the bonding surface of the host wafer include distortions in the outwardly radial direction; and
   the multiple zones comprise a central circular zone and one or more contiguous circular annular zones.

6. A method in accordance with claim 1, wherein distorting the bonding surface of the donor wafer is based on one or more of: the degree to which a surface deformation is elastic; the degree to which a surface deformation is plastic; and hysteresis effects in the time it takes for elastic deformations of the donor wafer surface to recover.

* * * * *